(12) United States Patent
Sugihara et al.

(10) Patent No.: US 7,728,667 B2
(45) Date of Patent: Jun. 1, 2010

(54) DIFFERENTIAL AMPLIFIER

(75) Inventors: Yoshinobu Sugihara, Musashino (JP); Satoru Togo, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 40 days.

(21) Appl. No.: 12/200,450

(22) Filed: Aug. 28, 2008

(65) Prior Publication Data

US 2009/0058522 A1    Mar. 5, 2009

(30) Foreign Application Priority Data

Aug. 31, 2007  (JP) .............................. 2007-226646
Jul. 28, 2008  (JP) .............................. 2008-193864

(51) Int. Cl.
    *H03F 3/45*    (2006.01)
(52) U.S. Cl. ...................................... 330/252; 330/261
(58) Field of Classification Search ................. 330/252, 330/260, 261
    See application file for complete search history.

(56) References Cited

U.S. PATENT DOCUMENTS

| | | | |
|---|---|---|---|
| 5,184,086 A | 2/1993 | Inohana et al. | |
| 5,677,646 A | 10/1997 | Entrikin | |
| 6,188,280 B1 | 2/2001 | Filip | |
| 7,002,412 B2 * | 2/2006 | Li | ............................... 330/252 |

FOREIGN PATENT DOCUMENTS

| | | |
|---|---|---|
| JP | 05-243870 A | 9/1993 |
| JP | 05-299947 A | 11/1993 |
| JP | 06-029760 A | 2/1994 |
| JP | 07-162248 A | 6/1995 |
| JP | 2000-261261 A | 9/2000 |
| JP | 2002-111409 A | 4/2002 |
| JP | 2002-524900 A | 8/2002 |
| JP | 2003-179439 A | 6/2003 |
| WO | 00/13309 A1 | 3/2000 |

* cited by examiner

*Primary Examiner*—Khanh V Nguyen
(74) *Attorney, Agent, or Firm*—Sughrue Mion, PLLC

(57) ABSTRACT

A differential amplifier is constituted of first emitter-follower transistors, second emitter-follower transistors, and amplification transistors whose bases are alternately connected to the emitters of the second emitter-follower transistors and whose collectors are connected to the emitters of the first emitter-follower transistors, as well as emitter resistors and constant current sources, whereby it is possible to reduce distortions of output signals in response to large-amplitude input signals, thus ensuring high-speed operation. It is possible to further incorporate base-grounded transistors and diodes, by which substantially the same collector-emitter voltage is applied to the emitter-follower transistors and amplification transistors, thus achieving the same power consumption and the same temperature variations with respect to these transistors. This reduces the nonlinear amplification error due to temperature differences of transistors, thus achieving flat gain characteristics in broad ranges of frequencies.

10 Claims, 5 Drawing Sheets

DIFFERENTIAL AMPLIFIER

BACKGROUND OF THE INVENTION

1. Field of the Invention

The present invention relates to differential amplifiers that amplify voltage differences between input signals.

The present application claims priority on Japanese Patent Application No. 2007-226646 and Japanese Patent Application No. 2008-193864, the contents of which are incorporated herein by reference.

2. Description of the Related Art

Various types of differential amplifiers have been disclosed in various documents such as Patent Document 1.

Patent Document 1: Japanese Unexamined Patent Application Publication No. 2000-261261

Patent Document 1 discloses a differential amplifier (serving as a bistable multivibrator or a transconductance amplifier) that is designed to suppress nonlinear errors. With reference to FIG. 3 of Patent Document 1, a pair of amplification transistors 1 and 2 are alternately connected with a pair of emitter-follower transistors 11 and 12, wherein emitter resistors 3 and 4 are connected to the emitters of the amplification transistors 1 and 2, while the collectors of the emitter-follower transistors 11 and 12 serve as open collector output terminals.

The output current (Iout1-Iout2) of the differential amplifier is represented by the following equation (in which RE designates the resistance of the emitter resistor), which does not include any terms representing the nonlinearity of transistors; hence, the differential amplifier has a superior linearity over a broad range of the input voltage (Vin1-Vin2).

$$Iout1 - Iout2 = \frac{Vin1 - Vin2}{RE}$$

With reference to FIG. 5 of Patent Document 1, a differential amplification circuit including amplification transistors 1 and 2 is interconnected with four current mirror circuits 21 to 24 forming a power transmission circuit (or a signal transmission circuit), thus solving drawbacks such as the operational instability of the differential amplifier.

In the amplification transistors 1 and 2 included in the differential amplifier shown in FIG. 3 of Patent Document 1, the emitter-collector voltage VCE is set identical to the base-emitter voltage VBE when no input voltage is applied thereto, whereby the amplification transistors may be easily saturated in operation when an input voltage is applied thereto. That is, the aforementioned differential amplifier suffers from a problem in that the output signal may be easily distorted as the input voltage increases.

The differential amplifier shown in FIG. 5 of Patent Document 1 is designed to solve the aforementioned problem; however, due to the complex constitution of the power transmission circuit and the relatively long propagation path thereof, it is very difficult to achieve high-speed operation.

In differential amplifiers, base-emitter voltages VBE of transistors have temperature dependencies, and transistors may differ from each other in heating conditions due to different power consumptions thereof. For this reason, it may be very difficult to adequately reduce gain errors and nonlinear amplification errors in broad ranges of frequencies. In other words, it is very difficult for differential amplifiers to possess flat gain characteristics in broad ranges of frequencies.

SUMMARY OF THE INVENTION

It is an object of the present invention to provide a differential amplifier whose output signal is reduced in distortion in response to a large-amplitude input voltage, thus achieving high-speed operation.

It is another object of the present invention to provide a differential amplifier which is capable of reducing a gain error and a nonlinear amplification error due to temperature differences of transistors in a broad range of frequencies.

In a first aspect of the present invention, a differential amplifier is constituted by a pair of first emitter-follower transistors whose bases receive input signals and whose collectors serve as the output terminals, a pair of second emitter-follower transistors whose bases are connected to the emitters of the first emitter-follower transistors, a pair of amplification transistors whose bases are alternately connected to the emitters of the second emitter-follower transistors and whose collectors are connected to the emitters of the first emitter-follower transistors, a pair of emitter resistors which are connected to the emitters of the amplification transistors, a first bias current setting circuit that is connected to the emitter resistors in common, and a pair of second bias current setting circuits, which are connected to the emitters of the second emitter-follower transistors.

Alternatively, a differential amplifier is constituted by a pair of first emitter-follower transistors whose bases receive input signals, a pair of second emitter-follower transistors whose bases are connected to the emitters of the first emitter-follower transistors, a pair of first amplification transistors whose bases are alternately connected to the emitters of the second emitter-follower transistors and whose collectors are connected to the emitters of the first emitter-follower transistors, a pair of first emitter resistors which are connected to the emitters of the first amplification transistors, a first bias current setting circuit that is connected to the first emitter resistors in common, a pair of second bias current setting circuits which are connected to the emitters of the second emitter-follower transistors, a pair of second amplification transistors whose bases are connected to the bases of the first amplification transistors and whose collectors serve as the output terminals, a pair of second emitter resistors which are connected to the emitters of the second amplification transistors, and a third bias current setting circuit that is connected to the second emitter resistors in common.

In the above, the third bias current setting circuit sets a third bias current, which is a k multiple (where k is an arbitrary constant) of a first bias current set by the first bias current setting circuit, wherein each of the sizes of the second amplification transistors is a k multiple of each of the sizes of the first amplification transistors, and wherein each of the resistances of the second emitter resistors is a 1/k of each of the resistances of the first emitter resistors.

In addition, it is possible to further introduce at least one of resistors, diodes, and constant voltage diodes, or a plurality of series circuits, which reduce the base voltages of the amplification transistors, are connected to the emitters of the second emitter-follower transistors.

Furthermore, all of the first emitter-follower transistors, the second emitter-follower transistors, and the amplification transistors are configured by bipolar transistors. Alternatively, all of the first emitter-follower transistors, the second emitter-follower transistors, and the amplification transistors are configured by MOS FETs.

As described above, the present invention differs from the conventionally-known differential amplifier, in which the emitters of the emitter-follower transistors are directly connected to the bases of the amplification transistors, whereas the present invention is characterized in that the emitters of the first emitter-follower transistors are connected to the bases of the second emitter-follower transistors whose emitters are connected to the bases of the amplification transistors. Thus, the emitter-collector voltages of the amplification transistors are substantially identical to the sum of the base-emitter voltages of the second emitter-follower transistors and the base-emitter voltages of the amplification transistors. This constitution remarkably reduces the distortions of the output signals produced in response to large-amplitude input signals, wherein a simple constitution having a short path is used to increase the emitter-collector voltages of the amplification transistors, thus ensuring high-speed operation in the differential amplifier.

In a second aspect of the present invention, a differential amplifier includes a pair of first emitter-follower transistors for buffering input signals, a pair of voltage drop generation circuits for generating voltage drops dependent upon the collector currents at the collectors of the first emitter-follower transistors, a pair of second emitter-follower transistor for buffering output signals of the first emitter-follower transistors, a pair of first amplification transistors which are alternately connected with the first emitter-follower transistors and are driven by the second emitter-follower transistors, a pair of second amplification transistors which are driven by the second emitter-follower transistors, thus providing output signals, a pair of first base-grounded transistors which are inserted between the first emitter-follower transistors and the first amplification transistors, a pair of second base-grounded transistors which are inserted between the second amplification transistors and the output terminals, and a bias circuit for supplying each of the first base-grounded transistors and the second base-grounded transistors with a bias voltage, thus setting the same collector-emitter voltage to each of the first emitter-follower transistors and each of the first amplification transistors and the second amplification transistors.

Alternatively, a differential amplifier includes a pair of first emitter-follower transistors for receiving input signals at the bases thereof, a pair of voltage drop generation circuits for generating voltage drops dependent upon the collector currents at the collectors of the first emitter-follower transistors, a pair of second emitter-follower transistors which are connected with the first emitter-follower transistors, a pair of first amplification transistors whose bases are alternately connected to the emitters of the second emitter-follower transistors and whose collectors are connected to the emitters of the first emitter-follower transistors, a pair of second amplification transistors whose bases are connected to the bases of the first amplification transistors, thus providing output signals, a pair of first base-grounded transistors inserted between the emitters of the first emitter-follower transistors and the collectors of the first amplification transistors, a pair of second base-grounded transistors which are connected to the collectors of the second amplification transistors, and a bias circuit for supplying each of the first base-grounded transistors and the second base-grounded transistors with a bias voltage, thus setting the same collector-emitter voltage to each of the first emitter-follower transistors, each of the first amplification transistors, and each of the second amplification transistors.

In the above, a voltage shift circuit for shifting DC voltages is further inserted in connection with the second emitter-follower transistors, the first amplification transistors, and the second amplification transistors.

The bias circuit is constituted of a constant current source and a series circuit which is constituted of a bias transistor whose collector and base are connected together, a second voltage drop circuit for generating a voltage drop dependent upon the collector current of the bias transistor, and a second voltage shift circuit, wherein the bias voltage is output from the connection point between the series circuit and the constant current source.

It is possible to further incorporate a pair of third emitter-follower transistors whose emitters are connected to the collectors of the second emitter-follower transistors, wherein the voltage drop generation circuits are constituted of a pair of first collector resistors, which are connected to the collectors of the first emitter-follower transistors, and a pair of second collector resistors, which are connected to the first collector resistors in series, and wherein the bases of the third emitter-follower transistors are connected to the connection points between the first collector resistors and the second collector resistors.

It is possible to provide a plurality of output circuits, which are connected in parallel and each of which is constituted of the second amplification transistors and the second base-grounded transistors as well as emitter resistors and a constant current source.

In the above, even when the base voltages of the first and second amplification transistors are increased, the collector voltages thereof are not substantially varied because the collectors thereof are connected to the emitters of the first and second base-grounded transistors. That is, all the amplification transistors included in the differential amplifier are very difficult to be saturated in operation in comparison with conventionally-known differential amplifiers. Due to the insertion of the voltage shift circuits, it is possible to increase the collector-emitter voltages of the first and second amplification transistors, which are thus further difficult to be saturated in operation.

It is possible to set the same collector-emitter voltages to each of the first emitter-follower transistors and each of the first and second amplification transistors, thus achieving the same power consumption thereof and thus suppressing local temperature variations thereof. That is, it is possible to reduce nonlinear amplification error due to temperature differences of transistors in broad ranges of frequencies.

BRIEF DESCRIPTION OF THE DRAWINGS

These and other objects, aspects, and embodiments of the present invention will be described in more detail with reference to the following drawings.

DESCRIPTION OF THE PREFERRED EMBODIMENTS

The present invention will be described in further detail by way of examples with reference to the accompanying drawings.

1. First Embodiment

Figure 1:
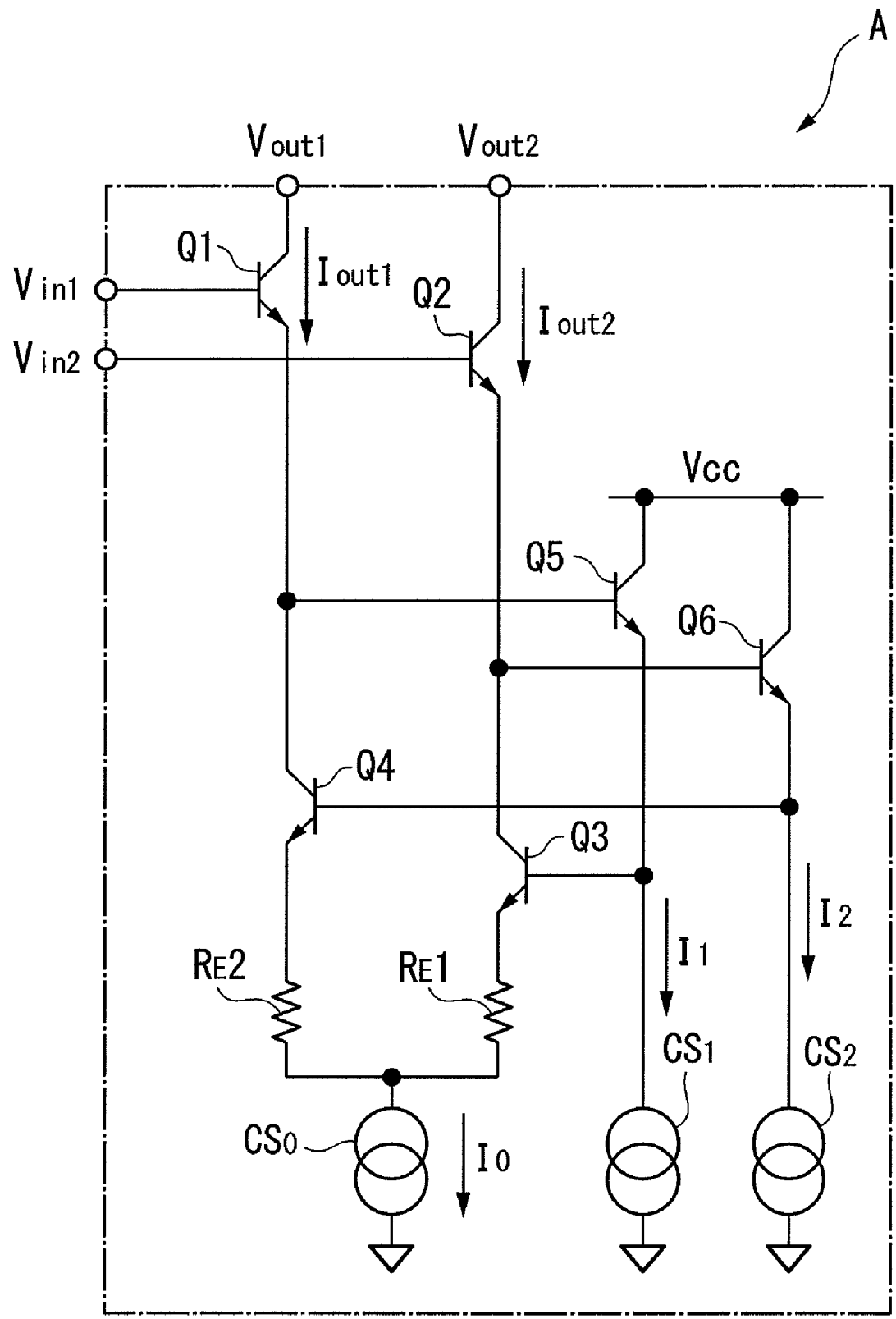
FIG. 1 is a circuit diagram showing a differential amplifier in accordance with a first embodiment of the present invention.

FIG. 1 is a circuit diagram showing the constitution of a differential amplifier A in accordance with a first embodiment of the present invention. The differential amplifier A is constituted of a pair of first emitter-follower transistors Q1 and Q2, a pair of amplification transistors Q3 and Q4, a pair of second emitter-follower transistors Q5 and Q6, a pair of emitter resistors RE1 and RE2, a first constant current source CS0 (or a first bias current setting circuit), and a pair of second constant current sources CS1 and CS2 (or second bias current setting circuits).

Within a pair of the first emitter-follower transistors Q1 and Q2, the base of the first emitter-follower transistor Q1 serves as a first input terminal of the differential amplifier A, which receives a first input signal Vin1 so as to output a first output voltage Vout1 via a collector resistor (externally connected to the collector thereof, not shown). The base of the first emitter-follower transistor Q2 serves as a second input terminal of the differential amplifier A, which receives a second input signal Vin2.

The collector of the first emitter-follower transistor Q1 serves as a first output terminal of the differential amplifier A so as to output the first output voltage Vout1. The collector of the first emitter-follower transistor Q2 serves as a second output terminal of the differential amplifier A so as to output a second output voltage Vout2 via a collector resistor (externally connected thereto, not shown). The emitter of the first emitter-follower transistor Q1 is connected to the collector of the amplification transistor Q4 and the base of the second emitter-follower transistor Q5. The emitter of the first emitter-follower transistor Q2 is connected to the collector of the amplification transistor Q3 and the base of the second emitter-follower transistor Q6.

The base of the amplification transistor Q3 is connected to the emitter of the second emitter-follower transistor Q5 and the positive terminal of the second constant current source CS1. The base of the amplification transistor Q4 is connected to the emitter of the second emitter-follower transistor Q6 and the positive terminal of the second constant current source CS2. The emitter of the amplification transistor Q3 is connected to the emitter resistor RE1, while the emitter of the amplification transistor Q4 is connected to the emitter resistor RE2.

Both the emitter resistors RE1 and RE2 are connected to the positive terminal of the first constant current source CS0 in common. The first constant current source CS0 makes a first bias current I0 flow through an external circuit. All the negative terminals of the first constant current source CS0 and the second constant current sources CS1 and CS2 are grounded. Both the collectors of the second emitter-follower transistors Q5 and Q6 are connected to a supply voltage line Vcc. Within a pair of the second constant current sources CS1 and CS2, the second constant current source CS1 sets a bias current I1 with respect to the second emitter-follower transistor Q5, while the second constant current source CS2 sets a bias current I2 with respect to the second emitter-follower transistor Q6.

The differential amplifier A having the aforementioned constituent elements is formed as an integrated circuit on a silicon substrate, wherein both the first emitter-follower transistors Q1 and Q2 have the same characteristics, both the amplification transistors Q3 and Q4 have the same characteristics, and both the second emitter-follower transistors Q5 and Q6 have the same characteristics, and wherein both the emitter resistors RE1 and RE2 have the same resistance. The bias current applied to each of the amplification transistors Q3 and Q4 is set to a half of the first bias current I0 (which is set by the first constant current source CS0), i.e., I0/2.

All of the first emitter-follower transistors Q1 and Q2, the amplification transistors Q3 and Q4, and the second emitter-follower transistors Q5 and Q6 are configured by NPN transistors (or bipolar transistors), which are formed on the silicon substrate.

Next, the operation of the differential amplifier A will be described in detail.

In the differential amplifier A, the base bias voltages applied to the first emitter-follower transistors Q1 and Q2 are appropriately set by an external circuit (not shown). In base-biased states, the input signals (or differential input signals) Vin1 and Vin2 are subjected to buffering by the first emitter-follower transistors Q1 and Q2, so that they are directly output at the emitters thereof. The output signals of the first emitter-follower transistors Q1 and Q2 are supplied to the bases of the second emitter-follower transistors Q5 and Q6, wherein they are subjected to buffering again and are then output at the emitters thereof. The output signals of the second emitter-follower transistors Q5 and Q6 are supplied to the bases of the amplification transistors Q3 and Q4.

The input signals of the amplification transistors Q3 and Q4 are amplified by an amplification factor, which is substantially set in response to the resistances of the emitter resistors RE1 and RE2 and the resistances of the collector resistors coupled to the collectors of the first emitter-follower transistors Q1 and Q2. The amplified signals are extracted via the collectors of the first emitter-follower transistors Q1 and Q2 in the differential amplifier A.

Specifically, the first input signal Vin1 is subjected to buffering by the first emitter-follower transistor Q1 and the second emitter-follower transistor Q5, then it is supplied to the base of the amplification transistor Q3 whose collector is coupled to the emitter of the first emitter-follower transistor Q2 receiving the second input signal Vin2. The second input signal Vin2 is subjected to buffering by the first emitter-follower transistor Q2 and the second emitter-follower transistor Q6, then it is supplied to the base of the amplification transistor Q4 whose collector is coupled to the emitter of the first emitter-follower transistor Q1 receiving the first input signal Vin1.

As a result, the base of the amplification transistor Q3 substantially receives the first input signal Vin1 already subjected to buffering by the first emitter-follower transistor Q1 and the second emitter-follower transistor Q5 while the collector current of the amplification transistor Q3 serves as the operation current of the first emitter-follower transistor Q2, thus causing the same distortion as the amplification transistor Q3 in the first emitter-follower transistor Q2.

The base of the amplification transistor Q4 substantially receives the second input signal Vin2 already subjected to buffering by the first emitter-follower transistor Q2 and the second emitter-follower transistor Q6 while the collector current of the amplification transistor Q4 serves as the operation current of the first emitter-follower transistor Q1, thus causing the same distortion as the amplification transistor Q4 in the first emitter-follower transistor Q1.

The distortions occurring in the first emitter-follower transistors Q1 and Q2 cancel the distortions of the amplification transistors Q3 and Q4.

Figure 3:
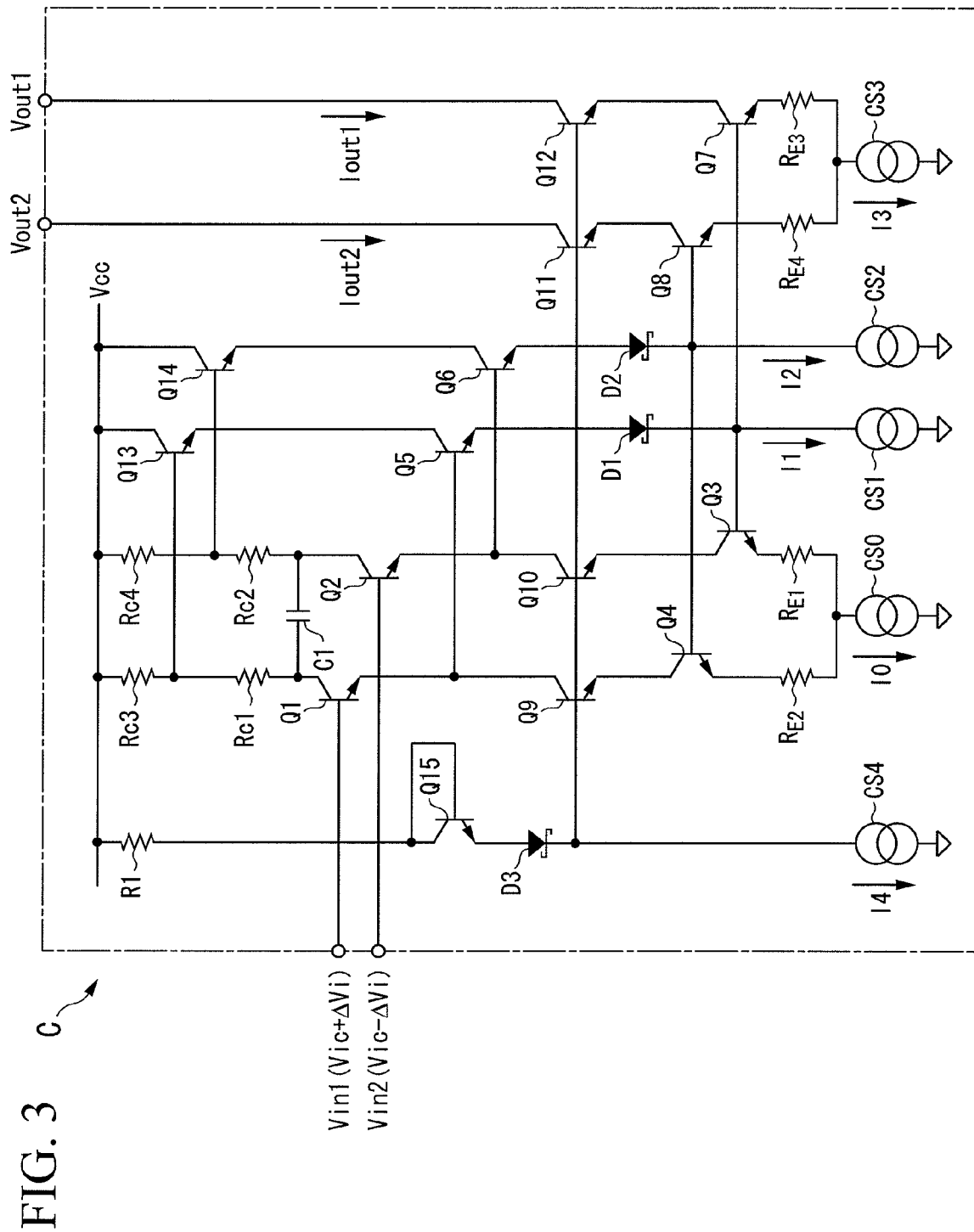
FIG. 3 is a circuit diagram showing a differential amplifier in accordance with a third embodiment of the present invention.

Similar to the conventionally-known differential amplifier shown in FIG. 3 of the Patent Document 1, the equation representing the difference between output currents Iout1 and Iout2 (flowing through the first emitter-follower transistors Q1 and Q2), i.e., Iout1-Iout2, does not include terms representing the nonlinearities (e.g., base-emitter voltages) of the amplification transistors Q3 and Q4; hence, the differential amplifier A has a superior linearity over a broad range of the differences between the input signals Vin1 and Vin2, i.e., Vin1-Vin2, and a very small nonlinear error.

In a non-signal mode in which both the input signals Vin1 and Vin2 are set to the same voltage, the emitter-collector voltages of the amplification transistors Q3 and Q4 are substantially equal to the sum of the base-emitter voltages of the amplification transistors Q3 and Q4 and the base-emitter voltages of the second emitter-follower transistors Q5 and Q6.

Therefore, it is possible to increase the emitter-collector voltages of the amplification transistors Q3 and Q4 in the differential amplifier A compared with the conventionally-known differential amplifier. That is, it is possible to maintain the desired performance of the amplifier transistors Q3 and Q4 without saturation even when the differential amplifier A receives input signals having relatively large amplitudes.

The emitter-collector voltages of the amplification transistors Q3 and Q4 are increased by way of the insertion of the second emitter-follower transistors Q5 and Q6 in the differential amplifier A. In other words, the emitter-collector voltages of the amplification transistors Q3 and Q4 are increased by way of a simple circuit constitution having a relatively short path, which ensures high-speed operation of the differential amplifier A.

2. Second Embodiment

Figure 2:
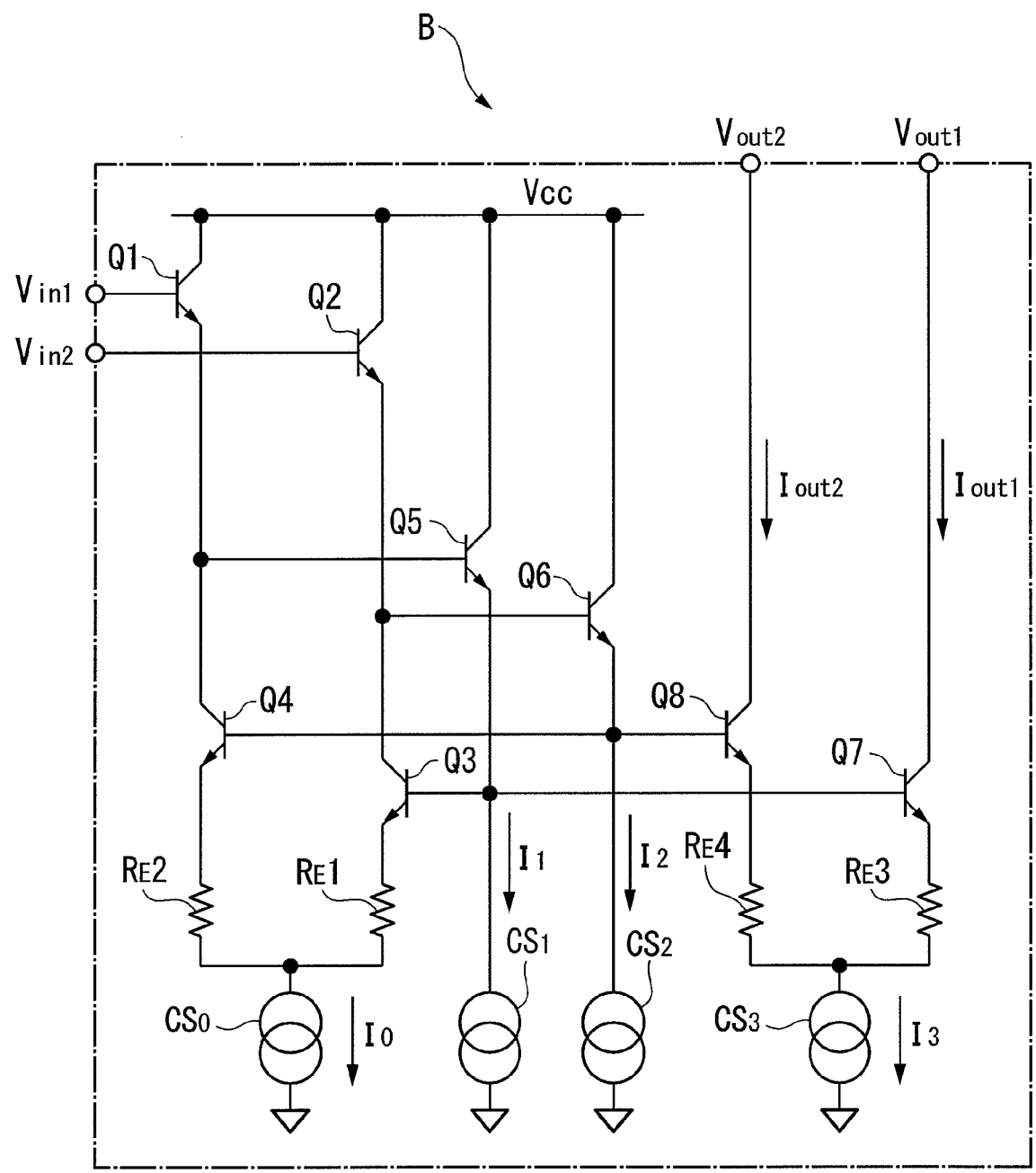
FIG. 2 is a circuit diagram showing a differential amplifier in accordance with a second embodiment of the present invention.

FIG. 2 is a circuit diagram showing the constitution of a differential amplifier B in accordance with a second embodiment of the present invention.

The differential amplifier B is designed by modifying the output constitution of the differential amplifier A, wherein the constitution of the differential amplifier B is basically similar to the constitution of the differential amplifier A. In the differential amplifier B shown in FIG. 2, the parts identical to those of the differential amplifier A shown in FIG. 1 are designated by the same reference numerals; hence, the following description is substantially given with respect to the constitutional difference between the differential amplifiers A and B.

The differential amplifier B differs from the differential amplifier A in that the collectors of the first emitter-follower transistors Q1 and Q2 are not used as the output terminals but are connected to the supply voltage line Vcc, wherein a pair of second amplification transistors Q7 and Q8 are newly introduced so that the bases thereof are connected to the emitters of the second emitter-follower transistors Q5 and Q6, and the collectors thereof serve as the output terminals of the differential amplifier B. Similar to the transistors Q1 to Q6, both the second amplification transistors Q7 and Q8 are configured by NPN transistors (or bipolar transistors).

Within a pair of the second amplification transistors Q7 and Q8, the emitter of the second amplification transistor Q7 is connected to a second emitter resistor RE3, and the emitter of the second amplification transistor Q8 is connected to a second emitter resistor RE4. Both the second emitter resistors RE3 and RE4 are connected to the positive terminal of a third constant current source (or a third bias current setting circuit) CS3 whose negative terminal is grounded.

The third constant current source CS3 sets a third bias current I3 as the k (where k is an arbitrarily set constant) multiple of the bias current I0 which is set by the first constant current source CS1. For this reason, the sizes of the second amplification transistors Q7 and Q8 are set to k multiple of the sizes of the "first" amplification transistors Q3 and Q4 so as to achieve substantially the same current density with respect to all of the transistors Q3, Q4, Q7, and Q8. The resistances of the second emitter resistors RE3 and RE4 are set to 1/k of the resistances of the "first" emitter resistors RE1 and RE2 so as to achieve substantially the same voltage drop with respect to all the resistors RE1, RE2, RE3, and RE4.

Next, the operation of the differential amplifier B will be described in detail.

Similar to the bases of the first amplification transistors Q3 and Q4, the bases of the second amplification transistors Q7 and Q8 are connected to the emitters of the second emitter-follower transistors Q5 and Q6, wherein the distortions of the first amplification transistors Q3 and Q4 are identical to the distortions of the second amplification transistors Q7 and Q8, and wherein all the distortions of the amplification transistors Q3, Q4, Q7, and Q8 are canceled by the distortions of the first emitter-follower transistors Q1 and Q2. Similar to the differential amplifier A, the differential amplifier B has a superior linearity over a broad range of differences between the input signals Vin1 and Vin2, i.e., Vin1-Vin2, and a very small nonlinear error.

In a non-signal mode, the emitter-collector voltages of the first amplification transistors Q3 and Q4 included in the differential amplifier B are identical to the emitter-collector voltages of the amplification transistors Q3 and Q4 included in the differential amplifier A. That is, the emitter-collector voltages of the first amplification transistors Q3 and Q4 are identical to the sum of the base-emitter voltages of the first amplification transistors Q3 and Q4 and the base-emitter voltages of the second emitter-follower transistors Q5 and Q6. Similar to the differential amplifier A, the differential amplifier B accepts the broad range of the input signal Vin1-Vin2 without causing saturation in the first amplification transistors Q3 and Q4.

The emitter-collector voltages of the first amplification transistors Q3 and Q4 are increased by way of the insertion of the second emitter-follower transistors Q5 and Q6. In other words, the emitter-collector voltages of the first amplification transistors Q3 and Q4 are increased by way of a simple circuit constitution having a short path, which ensures high-speed operation in the differential amplifier B.

In the differential amplifier B, the base bias voltages applied to the second amplification transistors Q7 and Q8 are lower than the base bias voltages applied to the first emitter-follower transistors Q1 and Q2 (which are used to extract the output signals Vout1 and Vout2 in the differential amplifier A) by substantially the base-emitter voltages of two transistors. Even when the same supply voltage Vcc as the differential amplifier A is used for the differential amplifier B, it is possible to increase the amplitude of the output signal Vout1-Vout2 without causing saturation in the second amplification transistors Q7 and Q8. In other words, the differential amplifier B can be reduced in the supply voltage Vcc so as to provide a certain amplitude of the output signal Vout1-Vout2 in comparison with the differential amplifier A.

The first and second embodiments can be further modified in a variety of ways as follows:

(1) It is possible to further introduce series circuits or diodes (or constant voltage diodes), which are used to reduce the base voltages of the amplification transistors Q3 and Q4 (or the base voltages of the amplification transistors Q3, Q4, Q7, and Q8) and which are connected to the emitters of the second emitter-follower transistors Q5 and Q6, thus adjusting the base voltages of the amplification transistors Q3 and Q4 (or the base voltages of the amplification transistors Q3, Q4, Q7, and Q8). This modification further increases the base-collector voltages of the amplification transistors Q3 and Q4; hence, it is possible to further increase the range of the input signal Vin1-Vin2.

(2) The differential amplifier B is designed such that the current densities of the second amplification transistors Q7 and Q8 are identical to the first amplification transistors Q3 and Q4, while the voltage drops of the second emitter resistors RE3 and RE4 are identical to the voltage drops of the first emitter transistors RE1 and RE2, thus reducing distortions. It is possible to perform fine adjustments of distortion characteristics by way of fine adjustments of current densities of the amplification transistors Q3, Q4, Q7, and Q8 and fine adjustments of voltage drops of the emitter resistors RE1, RE2, RE3, and RE4. It is possible to achieve desired distortion characteristics by increasing the ranges of fine adjustments with respect to current densities of the amplification transistors Q3, Q4, Q7, and Q8 and voltage drops of the emitter resistors RE1 to RE4, whereby it is possible to cancel distortions occurring in other circuit blocks (not shown). The adjustment of distortion characteristics can be easily achieved by inserting a resistor between the emitters of the first emitter-follower transistors Q1 and Q2 or by making the sizes of the first emitter-follower transistors Q1 and Q2 differ from the sizes of the first amplification transistors Q3 and Q4.

(3) All the transistors Q1 to Q8 are not necessarily configured of NPN transistors (or bipolar transistors). Instead, it is possible to use PNP transistors or MOS FETs for the transistors Q1 to Q8.

(4) The differential amplifiers A and B are not necessarily formed using the constant current sources CS0 to CS3 serving as the bias current setting circuits. When the differential amplifiers A and B do not need high-precision setting of bias currents, it is possible to replace the constant current sources CS0 to CS3 with resistors.

3. Third Embodiment

Due to temperature dependencies of base-emitter voltages of transistors and different heating conditions of transistors having different power consumptions, it is difficult to adequately reduce gain error and nonlinear amplification error in broad ranges of frequencies. In consideration of such drawbacks, the third embodiment is designed to achieve flat gain characteristics in a broad range of frequencies.

FIG. 3 is a circuit diagram showing the constitution of a differential amplifier C in accordance with a third embodiment of the present invention. The differential amplifier C is constituted of a pair of first emitter-follower transistors Q1 and Q2, a pair of first amplification transistors Q3 and Q4, a pair of second emitter-follower transistors Q5 and Q6, a pair of second amplification transistors Q7 and Q8, a pair of first base-grounded transistors Q9 and Q10, a pair of second base-grounded transistors Q11 and Q12, a pair of third emitter-follower transistors Q13 and Q14, a bias transistor Q15, a pair of first emitter resistors RE1 and RE2, a pair of second emitter resistors RE3 and RE4, a pair of first collector resistors RC1 and RC2, a pair of second collector resistors RC3 and RC4, a bias resistor R1, a capacitor C1, a pair of first voltage shift diodes (or voltage shift circuits) D1 and D2, a second voltage shift diode (or a second voltage shift circuit) D3, a first constant current source CS0, a pair of second constant current sources CS1 and CS2, a third constant current source CS3, and a fourth constant current source CS4.

Within the aforementioned constituent elements, the first emitter-follower transistors Q1 and Q2, the first amplification transistors Q3 and Q4, the second emitter-follower transistors Q5 and Q6, the second amplification transistors Q7 and Q8, the first emitter resistors RE1 and RE2, the second emitter resistors RE3 and RE4, the first constant current source CS0, the second constant current sources CS1 and CS2, and the third constant current source CS3 form a transconductance amplifier, which is a basic circuit portion of the differential amplifier C.

Within the aforementioned constituent elements, the second emitter-follower transistors Q5 and Q6, and the second constant current sources CS1 and CS2 form a pair of emitter-follower circuits. The first amplification transistors Q3 and Q4, the first emitter resistors RE1 and RE2, and the first constant current source CS0 form a first differential amplification circuit. The second amplification transistors Q7 and Q8, and the third constant current source CS3 form a second differential amplification circuit. The first collector resistors RC1 and RC2, and the second collector resistors RC3 and RC4 form a pair of voltage generation circuits. The bias transistor Q15, the bias resistor R1, the second voltage shift diode D3, and the fourth constant current source CS4 form a bias circuit.

The differential amplifier C is designed to add the first base-grounded transistors Q9 and Q10, the second base-grounded transistors Q11 and Q12, the third emitter-follower transistors Q13 and Q14, the bias transistor Q15, the first collector resistors RC1 and RC2, the second collector resistors RC3 and RC4, the bias resistor R1, the capacitor C1, the first voltage shift diodes D1 and D2, the second voltage shift diode D3, and the fourth constant current source CS4 to the transconductance amplifier (which is constituted of the aforementioned constituent elements), thus reducing negative influences on amplification characteristics due to local temperature variations of transistors.

Within the additional constituent elements described above, the bias resistor R1, the bias transistor Q15, the second voltage shift diode D3, and the fourth constant current source CS4 form the bias circuit which supplies a bias voltage to the bases of the first base-grounded transistors Q9 and Q10 and the bases of the second base-grounded transistors Q11 and Q12. In addition, the second amplification transistors Q7 and Q8, the second base-grounded transistors Q11 and Q12, the second emitter resistors RE3 and RE4, and the third constant current source CS3 form an output circuit of the differential amplifier C.

Within the first emitter-follower transistors Q1 and Q2, the base of the first emitter-follower transistor Q1 serves as a first input terminal of the differential amplifier C for receiving a first input signal Vin1, while the base of the first emitter-follower transistor Q2 serves as a second input terminal of the differential amplifier C for receiving a second input signal Vin2. The input signals Vin1 and Vin2 are produced by adding a small-amplitude AC voltage $\pm \Delta Vi$ to an input bias voltage Vic (i.e., DC voltage) which is set by an external bias circuit (not shown).

The collector of the first emitter-follower transistor Q1 is connected to the first collector resistor RC1 and the capacitor C1, while the collector of the first emitter-follower transistor Q2 is connected to the first collector resistor RC2 and the capacitor C1. The first collector resistor RC1 is connected to the second collector resistor RC3 and the base of the third emitter-follower transistor Q13, while the first collector resistor RC2 is connected to the second collector resistor RC4 and the base of the third emitter-follower transistor Q14. The capacitor C1 having a small capacitance is added to adjust the input impedance of the differential amplifier C.

The emitter of the first emitter-follower transistor Q1 is connected to the base of the second emitter-follower transistor Q5 and the collector of the first base-grounded transistor Q9. The emitter of the first emitter-follower transistor Q2 is connected to the base of the second emitter-follower transistor Q6 and the collector of the first base-grounded transistor Q10.

The emitter of the second emitter-follower transistor Q5 is connected to the anode of the first voltage shift diode D1, while the emitter of the second emitter-follower transistor Q6 is connected to the anode of the first voltage shift diode D2. The collector of the second emitter-follower transistor Q5 is connected to the emitter of the third emitter-follower transistor Q13, while the collector of the second emitter-follower transistor Q6 is connected to the emitter of the third emitter-follower transistor Q14.

The cathode of the first voltage shift diode D1 is connected to the base of the first amplification transistor Q3, the positive terminal of the second constant current source CS1, and the base of the second amplification transistor Q7. The cathode of the first voltage shift diode D2 is connected to the base of the first amplification transistor Q4, the positive terminal of the second constant current source CS2, and the base of the second amplification transistor Q8. The first voltage shift diodes D1 and D2 are inserted to achieve a certain voltage drop in the DC voltage; hence, they are configured of Schottky diodes each having the same voltage drop $V_D$.

The emitter of the first amplification transistor Q3 is connected to the first emitter resistor RE1, while the emitter of the first amplification transistor Q4 is connected to the first emitter resistor RE2. The collector of the first amplification transistor Q3 is connected to the emitter of the first base-grounded transistor Q10, while the collector of the first amplification transistor Q4 is connected to the emitter of the first base-grounded transistor Q9.

The first emitter resistors RE1 and RE2 are connected to the positive terminal of the first constant current source CS0 in common. The first constant current source CS0 forces a first bias current I0 to flow through an external circuit (constituted of the first emitter resistors RE1 and RE2). The negative terminal of the first constant current source CS0 and the negative terminals of the second constant current sources CS1 and CS2 are grounded. Within a pair of the second constant current sources CS1 and CS2, the constant current source CS1 sets a bias current I1 with respect to the second emitter-follower transistor Q5, while the constant current source CS2 sets a bias current I2 (=I1) with respect to the second emitter-follower transistor Q6.

The emitter of the second amplification transistor Q7 is connected to the second emitter resistor RE3, while the emitter of the second amplification transistor Q8 is connected to the second emitter resistor RE4. The collector of the second amplification transistor Q7 is connected to the emitter of the second base-grounded transistor Q12, while the collector of the second amplification transistor Q8 is connected to the emitter of the second base-grounded transistor Q11.

The second emitter resistors RE3 and RE4 are connected to the positive terminal of the third constant current source CS3 in common. The third constant current source CS3 forces a bias current I3 to flow through an external circuit (constituted of the second emitter resistors RE3 and RE4). The negative terminal of the third constant current source CS3 is grounded. In this connection, the bias current I0 of the first constant current source CS0 is identical to the bias current I3 of the third constant current source CS3.

The collector of the second base-grounded transistor Q12 serves as a first output terminal for outputting an output signal Vout1, while the collector of the second base-grounded transistor Q11 serves as a second output terminal for outputting an output signal Vout2. Specifically, the second base-grounded transistor Q12 forces an output current (or a collector current) Iout1 to flow in the first output terminal, while the second base-grounded transistor Q11 forces an output current (or a collector current) Iout2 to flow in the second output terminal. External resistors (i.e., collector resistors, not shown) are connected to the output terminals, so that the output signals (or output voltages) Vout1 and Vout2 are extracted from the output terminals.

The bias resistor R1 is connected to the base and collector of the bias transistor Q15 in common. The emitter of the bias transistor Q15 is connected to the anode of the second voltage shift diode D3. The cathode of the second voltage shift diode D3 is connected to the positive terminal of the fourth constant current source CS4 whose negative terminal is grounded. The second voltage shift diode D3 is inserted to achieve a certain voltage drop in the DC voltage, wherein it is configured of a Schottky diode. The bias resistor R1, the second collector resistors RC3 and RC4, and the collectors of the third emitter-follower transistors Q13 and Q14 are connected to a supply voltage line Vcc having a positive polarity. In the bias circuit, the bias resistor R1, the bias transistor Q15, and the second voltage shift diode D3 are connected in series, wherein the connection order of these elements is not necessarily limited to that shown in FIG. 3.

The differential amplifier C having the aforementioned constitution is formed as an integrated circuit on a silicon substrate. All the transistors included in the differential amplifier C are configured of NPN transistors (or bipolar transistors) formed on the silicon substrate. Specifically, all of the first emitter-follower transistors Q1 and Q2, the first amplification transistors Q3 and Q4, the second emitter-follower transistors Q5 and Q6, the second amplification transistors Q7 and Q8, the first base-grounded transistors Q9 and Q10, the second base-grounded transistors Q11 and Q12, and the third emitter-follower transistors Q13 and Q14-have substantially the same characteristics because they are formed on the silicon substrate having the uniform semiconductor characteristics. Similarly, all of the first emitter resistors RE1 and RE2, and the second emitter resistors RE3 and RE4 have the same resistance "RE". An internal bias voltage VB is applied to the bases of the first base-grounded transistors Q9 and Q10 and the bases of the second base-grounded transistors Q11 and Q12 by means of the bias circuit.

A bias current flowing through each of the first amplification transistors Q3 and Q4 is set to a half of the first bias current I0 (set by the first constant current source CS0), i.e., I0/2. A bias current flowing through each of the second amplification transistors Q7 and Q8 is set to a half of the third bias current I3 (=I0) (set by the third constant current source CS3), which is identical to the bias current I0/2 flowing through each of the first amplification transistors Q3 and Q4.

The first amplification transistors Q3 and Q4 are connected with the first base-grounded transistors Q9 and Q10, each of which is driven by the internal bias voltage VB supplied from the bias circuit. The second amplification transistors Q7 and Q8 are connected with the second base-grounded transistors Q11 and Q12 (similar to the first base-grounded transistors Q9 and Q10), each of which is driven by the internal bias voltage VB.

All of the first collector resistors RC1 and RC2 and the second collector resistors RC3 and RC4 have the same resistance, which is set to (RE+1/gm), where RE designates the resistance of the emitter resistors RE1 to RE4, and gm designates a transconductance (=$I_{C0}/V_T$) in a non-signal mode of the first emitter-follower transistors Q1 and Q2. Each of the collectors of the first emitter-follower transistors Q1 and Q2 is connected with a resistance 2 (RE+1/gm). In the above, $I_{C0}$ represents the bias current I0/2 applied to each of the first emitter-follower transistors Q1 and Q2, and VT designates a thermal voltage applied to each of the first emitter-follower transistors Q1 and Q2.

The bias circuit produces the internal bias voltage VB by subtracting the sum of voltage drops caused by the bias resistor R1, the bias transistor Q15, and the second voltage shift diode D3 from the supply voltage Vcc, wherein the internal bias voltage VB is determined such that the same emitter-collector voltage is applied to each of the first emitter-follower transistors Q1 and Q2, the first amplification transistors Q3 and Q4, and the second amplification transistors Q7 and Q8.

Next, the operation of the differential amplifier C will be described in detail.

The input signals Vin1 and Vin2, which correspond to the input bias voltage Vic (i.e., DC voltage) added with the small-amplitude AC voltage ±ΔVi, are applied to the differential amplifier C, wherein the input signals Vin1 and Vin2 are supplied to the bases of the first emitter-follower transistors Q1 and Q2, in which they are subjected to buffering and are then output at the emitters thereof.

The output signals of the first emitter-follower transistors Q1 and Q2 are supplied to the bases of the second emitter-follower transistors Q5 and Q6, in which they are subjected to buffering and are then output at the emitters thereof. The output signals of the second emitter-follower transistors Q5 and Q6 are supplied to the bases of the first amplification transistors Q3 and Q4 and the bases of the second amplification transistors Q7 and Q8 via the first voltage shift diodes D1 and D2.

The input signals supplied to the bases of the first amplification transistors Q3 and Q4 are amplified so that the amplified signals are output from the collectors thereof and are then fed back to the emitters of the first emitter-follower transistors Q1 and Q2 via the first base-grounded transistors Q9 and Q10.

The input signals (or input voltages) supplied to the bases of the second amplification transistors Q7 and Q8 are amplified and are then converted into collector currents in response to the transconductances of the second amplification transistors Q7 and Q8, whereby the output currents Iout1 and Iout2 are correspondingly output via the collectors of the second base-grounded transistors Q11 and Q12 (forming the output terminals of the differential amplifier C) as the output signals of the transconductance amplifier. When the external resistors both having the prescribed resistance are connected to the output terminals, the output voltages Vout1 and Vout2 of the differential amplifier C depend upon the resistance RE of the second emitter resistors RE3 and RE4 and the resistance of the external resistors.

The input signal Vin1 is subjected to buffering by the first emitter-follower transistor Q1 and the second emitter-follower transistor Q5 and then supplied to the base of the first amplification transistor Q3 whose collector is connected to the emitter of the first emitter-follower transistor Q2 (whose base receives the input signal Vin2) via the first voltage shift diode D1. The input signal Vin2 is subjected to buffering by the first emitter-follower transistor Q2 and the second emitter-follower transistor Q6 and then supplied to the base of the first amplification transistor Q4 whose collector is connected to the emitter of the first emitter-follower transistor Q1 (whose base receives the input signal Vin1) via the first voltage shift diode D2.

That is, the first amplification transistor Q3 receives the input signal Vin1 already subjected to buffering by the first emitter-follower transistor Q1 and the second emitter-follower transistor Q5 at the base thereof while providing the collector current thereof as the operation current for the first emitter-follower transistor Q2, so that the distortion substantially identical to the distortion occurring in the first amplification transistor Q3 is forced to occur in the first emitter-follower transistor Q2.

The first amplification transistor Q4 receives the input signal Vin2 already subjected to buffering by the first emitter-follower transistor Q2 and the second emitter-follower transistor Q6 at the base thereof while providing the collector current thereof as the operation current for the first emitter-follower transistor Q1, so that the distortion substantially identical to the distortion occurring in the first amplification transistor Q4 is forced to occur in the first emitter-follower transistor Q1.

The distortions occurring in the first emitter-follower transistors Q1 and Q2 may substantially cancel the distortions occurring in the first amplification transistors Q3 and Q4.

Since the equation representing the difference between the output currents Iout1 and Iout2 of the first amplification transistors Q3 and Q4, i.e., "Iout1-Iout2", does not include any terms regarding the nonlinearity of the base-emitter voltages of the first amplification transistors Q3 and Q4, it is possible to realize a differential amplifier C having a very small nonlinear error and superior linearity over a broad range of differences between the input signals Vin1 and Vin2, i.e., "Vin1-Vin2".

Since the collectors of the first amplification transistors Q3 and Q4 are connected to the emitters of the first base-grounded transistors Q9 and Q10 while the collectors of the second amplification transistors Q7 and Q8 are connected to the emitters of the second base-grounded transistors Q11 and Q12, substantially no variations occur in the collector voltages of the amplification transistors Q3, Q4, Q7, and Q8, which are thus difficult to be saturated in operation, even when the base voltages of the amplification transistors Q3, Q4, Q7, and Q8 increase.

Due to the insertion of the first voltage shift diodes D1 and D2, it is possible to increase the emitter-collector voltages of the amplification transistors Q3, Q4, Q7, and Q8, which are thus further difficult to be saturated in operation.

In the differential amplifier C, the bias circuit supplies the bases of the first base-grounded transistors Q9 and Q10 and the bases of the second base-grounded transistors Q11 and Q12 with the internal bias voltage VB, which is determined such that substantially the same collector-emitter voltage VCE is applied to each of the first emitter-follower transistors Q1 and Q2, each of the first amplification transistors Q3 and Q4, and each of the second amplification transistors Q7 and Q8 in the non-signal mode (in which the input signal Vin1 equals the input signal Vin2). In the differential-input mode (in which the input signal Vin1 differs from the input signal Vin2), substantially the same collector current (or bias current) is applied to each of the first emitter-follower transistor Q1, the first amplification transistor Q4, and the second amplification transistor Q8 while substantially the same collector current (or bias current) is applied to each of the first emitter-follower transistor Q2, the first amplification transistor Q3, and the second amplification transistor Q7.

That is, normally the same collector-emitter voltage VCE is applied to each of the first emitter-follower transistor Q1, the first amplification transistor Q4, and the second amplification transistor Q8 so that these transistors normally produce the same collector current (or bias current), whereby they have the same characteristics, i.e., the same power consumption and the same temperature variations. Similarly, normally the same collector-emitter voltage VCE is applied to each of the first emitter-follower transistor Q2, the first amplification transistor Q3, and the second amplification transistor Q7 so that these transistors normally produce the same collector current (or bias current), whereby they have the same characteristics, i.e., the same power consumption and the same temperature variations.

The differential amplifier C is designed such that all of the first collector resistors RC1 and RC2 and the second collector resistors RC3 and RC4 have the same resistance (RE+1/gm), wherein the voltage at the connection point between the collector resistors RC1 and RC3 is subjected to buffering by the third emitter-follower transistor Q13 and then supplied to the collector of the second emitter-follower transistor Q5, while the voltage at the connection point between the collector resistors RC2 and RC4 is subjected to buffering by the third emitter-follower transistor Q14 and then supplied to the collector of the second emitter-follower transistor Q6. Thus, normally the same collector-emitter voltage VCE is applied to each of the second emitter-follower transistors Q5 and Q6 irrespective of variations of the input differential voltage (i.e., the difference between the input signals Vin1 and Vin2), variations of the supply voltage Vcc, and variations of input common-mode voltage applied to the differential amplifier C. Due to the insertion of the second constant current sources CS1 and CS2, the bias current I1 of the second emitter-follower transistor Q5 is normally identical to the bias current I2 of the second emitter-follower transistor Q6.

Since the same power consumption normally occurs in both of the second emitter-follower transistors Q5 and Q6, no local temperature variations occur in the differential amplifier C, whereby no variation occurs in the base-emitter voltage VBE in each of the second emitter-follower transistors Q5 and Q6.

With respect to the transistors included in the basic circuit portion (forming the transconductance amplifier) of the differential amplifier C, it is possible to suppress local temperature variations in the second emitter-follower transistors Q5 and Q6 so as to stabilize the base-emitter voltage VBE thereof, and substantially the same local temperature variations occur in each of the first emitter-follower transistors Q1 and Q2, each of the first amplification transistors Q3 and Q4, and each of the second amplification transistors Q7 and Q8, whereby it is possible to cancel influences of base-emitter voltages VBE thereof. Thus, it is possible for the differential amplifier C to achieve a very small nonlinear amplification error and flat differential amplification characteristics over broad ranges of frequencies.

The bias circuit is constituted of the bias transistor Q15, the bias resistor R1, the second voltage shift diode D3, and the fourth constant current source CS4 so as to supply the first base-grounded transistors Q9 and Q10 and the second base-grounded transistors Q11 and Q12 with the bias voltage VB, which varies to cancel variations of the collector-emitter voltage VCE applied to each of the amplification transistors Q3, Q4, Q7, and Q8 dependent upon variations of the surrounding temperature. That is, the differential amplifier C is designed to stabilize the power consumption in each of the amplification transistors Q3, Q4, Q7, and Q8 irrespective of variations of the surrounding temperature.

The power consumption of each transistor will be described in detail below.

(1) Non-signal Mode

Calculations are performed using Vcc=2.5V, RE=100Ω, I0=4 mA, Vic=1.9V, $V_T$=30mV (at temperature T=75° C.), and VBE=0.8V (representing the base-emitter voltage of each transistor) in the non-signal mode, so that the base voltage of 0.84V is calculated with respect to each of the first base-grounded transistors Q9 and Q10, while the collector-emitter voltage VCE=0.94V is calculated for each of the first emitter-follower transistors Q1 and Q2 and each of the first amplification transistors Q3 and Q4. In addition, the bias current of 2 mA is calculated for each of the transistors Q1 to Q4.

Since all the transistors Q1 to Q4 have the same collector-emitter voltage VCE and the same bias current, they have the same power consumption.

In the above, the collector-emitter voltage VCE=1.17V and the same bias current are set to each of the second emitter-follower transistors Q5 and Q6; hence, both the transistors Q5 and Q6 have the same power consumption.

(2) Small Signal Input Mode

When the input signal Vin1 (corresponding to the sum of the input bias voltage Vic and the small voltage +ΔVi) is supplied to the base of the first emitter-follower transistor Q1 while the input signal V1 (corresponding to the sum of the input bias voltage Vic and the small voltage −ΔVi) is supplied to the base of the first emitter-follower transistor Q2, emitter voltage variations ΔVe3 and ΔVe4 of the first amplification transistors Q3 and Q4 are represented by equations (1) and (2).

$$\Delta Ve3 = +\Delta Vi - \Delta Vbe1 - \Delta Vbe5 - \Delta V_D - \Delta Vbe3 \quad (1)$$

$$\Delta Ve4 = -\Delta Vi - \Delta Vbe2 - \Delta Vbe6 - \Delta V_D - \Delta Vbe4 \quad (2)$$

The difference between the emitter voltage variations ΔVe3 and ΔVe4 of the first amplification transistors Q3 and Q4 is represented by an equation (3).

$$\Delta Ve3 - \Delta Ve4 = 2\Delta Vi - (\Delta Vbe1 - \Delta Vbe4) - (\Delta Vbe2 - \Delta Vbe3) - (\Delta Vbe5 - \Delta Vbe6) \quad (3)$$

On the presumption in which both the first emitter-follower transistor Q1 and the first amplification transistor Q4 have the same variations of power consumption, both the first emitter-follower transistor Q2 and the first amplification transistor Q3 have the same variations of power consumption, and both the second emitter-follower transistors Q5 and Q6 have zero variations of power consumption, and in which ΔVbe1=ΔVbe4, ΔVbe2=ΔVbe3, and ΔVbe5=ΔVbe6=0, the equation (3) is transformed into an equation (4).

$$\Delta Ve3 - \Delta Ve4 = 2\Delta Vi \quad (4)$$

Collector current variations of the first emitter-follower transistor Q2 (substantially corresponding to collector current variations of the first amplification transistors Q3) are represented as ΔIi=ΔVi/RE, while collector current variations of the first emitter-follower transistor Q1 (substantially corresponding to collector current variations of the first amplification transistor Q4) are represented as −ΔIi=−ΔVi/RE. In addition, collector voltage variations ΔVc1 of the first emitter-follower transistor Q1 are represented by an equation (5), while emitter voltage variations ΔVe1 of the first emitter-follower transistor Q1 are represented by an equation (6).

$$\Delta Vc1 = -2\left(RE + \frac{1}{gm}\right) \cdot (-\Delta Ii) = 2\left(1 + \frac{1}{RE \cdot gm}\right) \cdot \Delta Ii \quad (5)$$

-continued $$\Delta Ve1 = \Delta Vi - \Delta Ve1 \qquad (6)$$
$$= \Delta Vi - \left(\frac{1}{gm}\right) \cdot (-\Delta Ii)$$
$$= \left(1 + \frac{1}{RE \cdot gm}\right) \cdot \Delta Vi$$

Thus, collector-emitter voltage variations ΔVce1 of the first emitter-follower transistor Q1 are represented by an equation (7) based on the equations (5) and (6).

$$\Delta Vce1 = \left(1 + \frac{1}{RE \cdot gm}\right) \cdot \Delta Vi \qquad (7)$$

With respect to the first amplification transistor Q4, collector voltage variations ΔVc4 and emitter voltage variations ΔVe4 are represented by equations (8) and (9).

$$\Delta Vc4 = -\Delta Vbe9 = -\frac{1}{gm} \cdot (-\Delta Ii) = \frac{1}{RE \cdot gm} \cdot \Delta Vi \qquad (8)$$

$$\Delta Ve4 = -\Delta Vi \qquad (9)$$

Thus, collector-emitter voltage variations ΔVce4 of the first amplification transistor Q4 are represented by an equation (10) based on the equations (8) and (9).

$$\Delta Vce4 = \left(1 + \frac{1}{RE \cdot gm}\right) \cdot \Delta Vi \qquad (10)$$

The equations (7) and (10) show that the collector-emitter voltage variations ΔVce1 of the first emitter-follower transistor Q1 is equal to the collector-emitter voltage variations ΔVce4 of the first amplification transistors Q4. In addition, the collector current of the first emitter-follower transistor Q1 is identical to the collector current of the first amplification transistor Q4; hence, these transistors Q1 and Q4 normally have the same power consumption. Similar to the transistors Q1 and Q4, both the transistors Q2 and Q3 normally have the same power consumption.

The base-emitter voltage variations ΔVbe1 of the first emitter-follower transistor Q1 are identical to the base-emitter voltage variations ΔVbe4 of the first amplification transistor Q4, while the base-emitter voltage variations ΔVbe2 of the first emitter-follower transistor Q2 are identical to the base-emitter voltage variations ΔVbe3 of the first amplification transistor Q3. That is, the aforementioned relationships of ΔVbe1=ΔVbe4 and ΔVbe2=ΔVbe3 are established with respect to the first emitter-follower transistors Q1 and Q2 and the first amplification transistors Q3 and Q4.

With respect to the second emitter-follower transistor Q5, collector voltage variations ΔVc5 and emitter voltage variations ΔVe5 are represented by equations (11) and (12).

$$\Delta Vc5 = -\left(RE + \frac{1}{gm}\right) \cdot (-\Delta Ii) = \left(1 + \frac{1}{RE \cdot gm}\right) \cdot \Delta Vi \qquad (11)$$

$$\Delta Ve5 = \left(1 + \frac{1}{RE \cdot gm}\right) \cdot \Delta Vi \qquad (12)$$

That is, the collector voltage variations ΔVc5 are identical to the emitter voltage variations ΔVe5 with respect to the second emitter-follower transistor Q5. In addition, the second constant current source CS1 sets a constant value to the bias current I1 of the second emitter-follower transistor Q5.

For this reason, no variations occur in the power consumption of the second emitter-follower transistor Q5. The same thing can be said for the second emitter-follower transistor Q6. Therefore, the aforementioned relationship of ΔVbe5=ΔVbe6=0 is established with respect to base-emitter voltage variations ΔVbe5 and ΔVbe6 of the second emitter-follower transistors Q5 and Q6.

As described above, the relationships of ΔVbe1=ΔVbe4 and ΔVbe2=ΔVbe3 are established with respect to the base-emitter voltages of the first emitter-follower transistors Q1 and Q2 and the base-emitter voltages of the first amplification transistors Q3 and Q4. In addition, the relationship of ΔVbe5=ΔVbe6=0 is established with respect to the base-emitter voltages of the second emitter-follower transistors Q5 and Q6. Furthermore, the first amplification transistors Q3 and Q4 substantially match the second amplification transistors Q7 and Q8 in terms of the characteristics thereof; hence, these transistors produce currents having high linearity. Since each of differential pairs of transistors has the same power consumption, it is possible to achieve a high linearity in the operation of the differential amplifier C.

When the power consumption is varied with respect to the first base-grounded transistors Q9 and Q10 (inserted at the collectors of the first amplification transistors Q3 and Q4) and the third emitter-follower transistors Q13 and Q14 (inserted at the collectors of the second emitter-follower transistors Q5 and Q6), the base-emitter voltages Vbe9, Vbe10, Ve13, and Ve14 of the transistors Q9, Q10, Q13, and Q14 are varied so that the collector voltages of the first amplification transistors Q3 and Q4 and the collector voltages of the second emitter-follower transistors Q5 and Q6 are correspondingly varied. However, variations of collector voltages due to variations of power consumption are very small; hence, their influences on the nonlinearity and gain can be neglected.

As shown in the equation (5), the collector voltage of the first emitter-follower transistor Q1 is varied by 2{1+(1/(RE·gm))} times of the input voltage variations ΔVi. For this reason, the high-frequency input impedance in view of the base of the first emitter-follower transistor Q1, i.e., the high-frequency input impedance of the differential amplifier C, becomes negative due to the base-collector capacitance of the first emitter-follower transistor Q1; this may cause ringing to easily occur when the differential amplifier C inputs high-frequency pulses. In order to avoid the occurrence of ringing, it is effective to adjust the electrostatic capacitance of the capacitor C1, thus adjusting the high-frequency input impedance in positive polarity.

4. Fourth Embodiment

Figure 4:
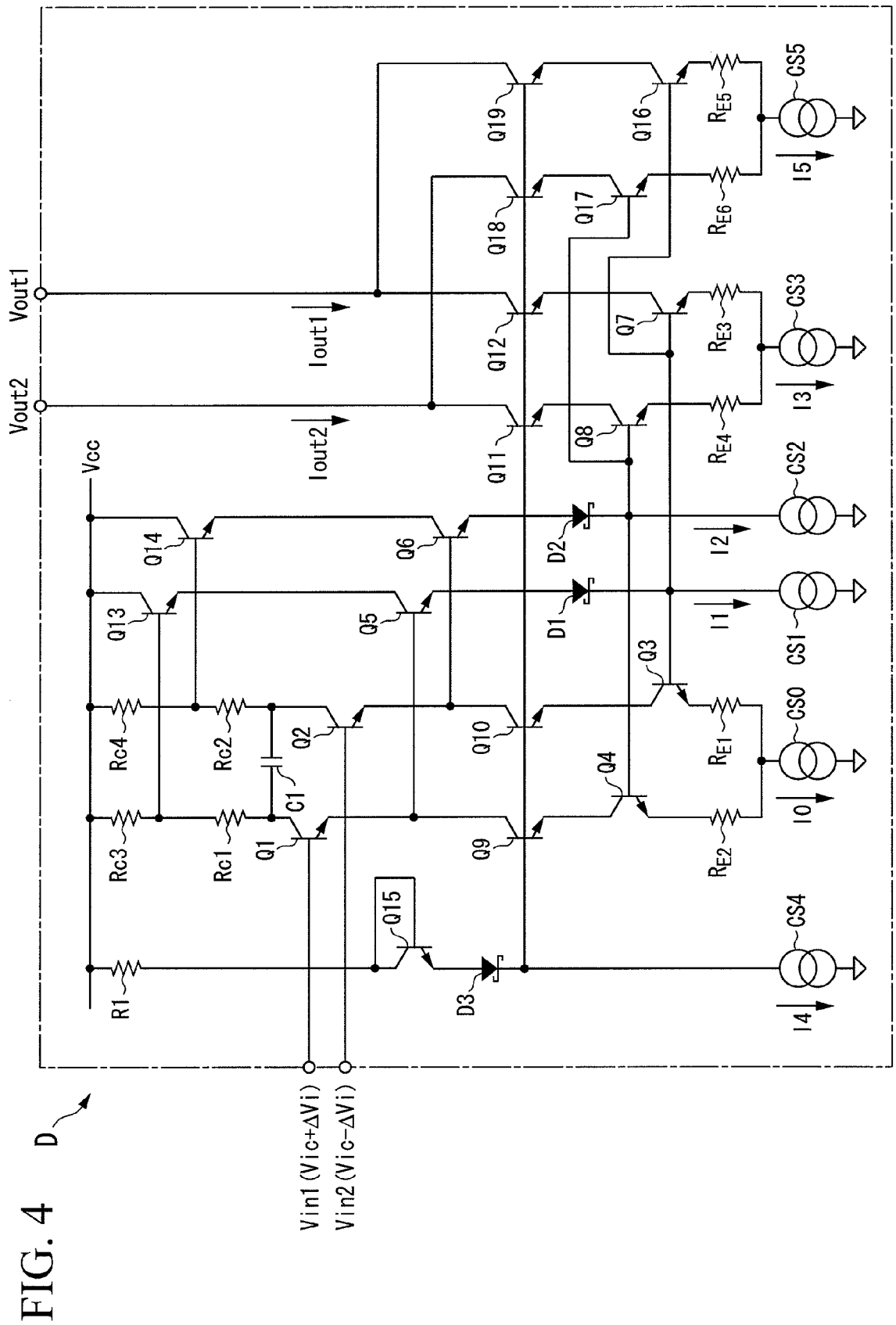
FIG. 4 is a circuit diagram showing a differential amplifier in accordance with a fourth embodiment of the present invention.

Next, a fourth embodiment of the present invention will be described with reference to FIG. 4. FIG. 4 is a circuit diagram showing the constitution of a differential amplifier D according to the fourth embodiment, wherein parts identical to those of the differential amplifier C shown in FIG. 3 are designated by the same reference numerals. The differential amplifier D is characterized by arranging first and second output circuits (each of which is substantially identical to the output circuit included in the differential amplifier C) in parallel. Specifically, the first output circuit is constituted of the second amplification transistors Q7 and Q8, the second base-grounded transistors Q11 and Q12, the second emitter resistors RE3 and RE4, and the fourth constant current source CS4, while the second output circuit is constituted of a pair of third amplification transistors Q16 and Q17, a pair of third base-grounded transistors Q18 and Q19, a pair of third emitter resistors RE5 and RE6, and a fifth constant current source CS5. The second output circuit is connected in parallel with the first output circuit, wherein the second output circuit performs substantially the same operation as the first output circuit.

Due to the insertion of the two output circuits connected in parallel, the differential amplifier D can double the output currents thereof in comparison with the output currents of the differential amplifier C; in other words, the differential amplifier D can double the gain of the transconductance amplifier in comparison with the gain of the transconductance amplifier of the differential amplifier C. The same gain of the differential amplifier C can be easily achieved by the differential amplifier D by reducing the bias current of the output circuit to a half, wherein it is possible to reduce the overall power consumption in the differential amplifier D compared with the differential amplifier C.

5. Fifth Embodiment

Figure 5:
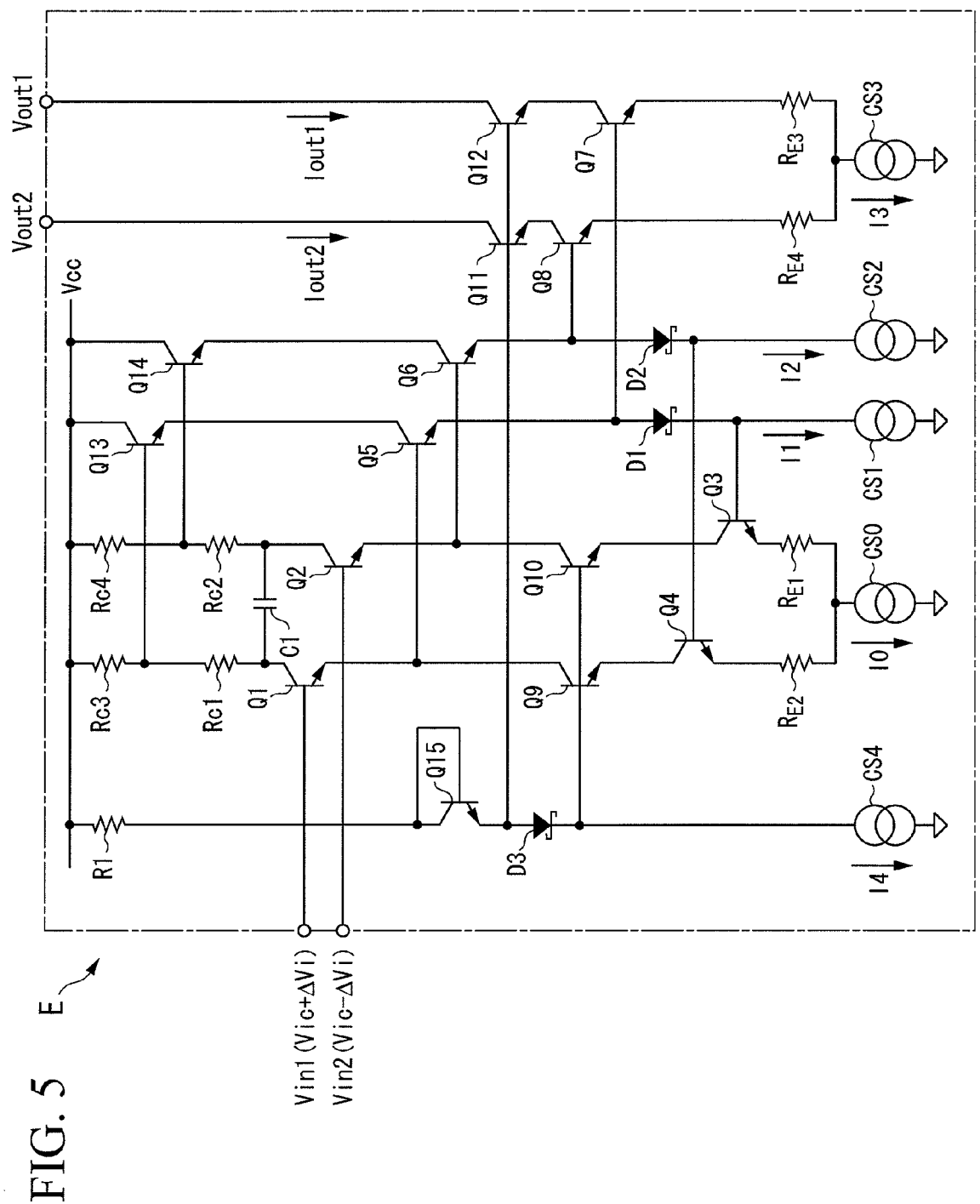
FIG. 5 is a circuit diagram showing a differential amplifier in accordance with a fifth embodiment of the present invention.

Next, a fifth embodiment of the present invention will be described with reference to FIG. 5. FIG. 5 is a circuit diagram showing the constitution of a differential amplifier E according to the fifth embodiment, wherein parts identical to those of the differential amplifier C shown in FIG. 3 are designated by the same reference numerals. In the differential amplifier E, the bases of the second amplification transistors Q7 and Q8 are directly connected to the anodes of the first voltage shift diodes D1 and D2 and the emitters of the second emitter-follower transistors Q5 and Q6. In addition, the bases of the second base-grounded transistors Q11 and Q12 are directly connected to the anode of the second voltage shift diode D3 and the emitter of the bias transistor Q15.

That is, the base voltages of the second amplification transistors Q7 and Q8 included in the differential amplifier E are increased to be higher than the base voltages of the second amplification transistors Q7 and Q8 included in the differential amplifier C by the voltage drop $V_D$ applied to each of the first voltage shift diodes D1 and D2, and the collector voltages of the transistors Q7 and Q8 included in the differential amplifier E are increased to be higher than the collector voltages of the transistors Q7 and Q8 included in the differential amplifier C by the voltage drop $V_D$ of the second voltage shift diode D3.

For this reason, the collector-emitter voltages Vce of the second base-grounded transistors Q11 and Q12 included in the differential amplifier E become smaller than the collector-emitter voltages of the second base-grounded transistors Q11 and Q12 included in the differential amplifier C. That is, the differential amplifier E is advantageous in that transistors having low breakdown voltages can be used for the transistors Q11 and Q12.

The third to fifth embodiments can be further modified in a variety of ways, which will be described below.

(1) The transistors Q1 to Q19 are not necessarily configured of NPN transistors (or bipolar transistors); hence, they can be configured of PNP transistors or MOS FETs.

(2) The voltage shift diodes D1 to D3 are not necessarily configured of Schottky diodes, which can be replaced with other types of diodes (or generally-known silicon diodes) as necessary. Alternatively, the diodes D1 to D3 can be replaced with resistors, for example.

(3) The constant current sources CS0 to CS3 are used as the bias current setting circuits; but this is not a restriction. When differential amplifiers are not necessarily designed to precisely set bias currents to transistors, it is possible to replace the constant current sources CS0 to CS3 with resistors, for example.

(4) The differential amplifier D includes two output circuits, whereas the number of output circuits is not necessarily limited to two; hence, it is possible to incorporate three or more output circuits in each differential amplifier.

Lastly, the present invention is not necessarily limited to the first to fifth embodiments, which can be further modified in a variety of ways within the scope of the invention as defined in the appended claims.

What is claimed is:

1. A differential amplifier comprising:
   a pair of first emitter-follower transistors for buffering input signals;
   a pair of voltage drop generation circuits for generating voltage drops dependent upon collector currents at the collectors of the first emitter-follower transistors;
   a pair of second emitter-follower transistor for buffering output signals of the first emitter-follower transistors;
   a pair of first amplification transistors which are alternately connected with the first emitter-follower transistors and are driven by the second emitter-follower transistors;
   a pair of second amplification transistors which are driven by the second emitter-follower transistors, thus providing output signals;
   a pair of first base-grounded transistors which are inserted between the first emitter-follower transistors and the first amplification transistors;
   a pair of second base-grounded transistors which are inserted between the second amplification transistors and output terminals; and
   a bias circuit for supplying each of the first base-grounded transistors and the second base-grounded transistors with a bias voltage, thus setting a same collector-emitter voltage to each of the first emitter-follower transistors and each of the first amplification transistors and the second amplification transistors.

2. A differential amplifier according to claim 1 further comprising a voltage shift circuit in connection with the second emitter-follower transistors, the first amplification transistors, and the second amplification transistors.

3. A differential amplifier according to claim 2, wherein the bias circuit is constituted of a constant current source and a series circuit which is constituted of a bias transistor whose collector and base are connected together, a second voltage drop circuit for generating a voltage drop dependent upon a collector current of the bias transistor, and a second voltage shift circuit, and wherein the bias voltage is output from a connection point between the series circuit and the constant current source.

4. A differential amplifier according to claim 1 further comprising a pair of third emitter-follower transistors whose emitters are connected to the collectors of the second emitter-follower transistors, wherein the voltage drop generation circuits are constituted of a pair of first collector resistors, which are connected to the collectors of the first emitter-follower transistors, and a pair of second collector resistors, which are connected to the first collector resistors in series, and wherein bases of the third emitter-follower transistors are connected to connection points between the first collector resistors and the second collector resistors.

5. A differential amplifier according to claim 1 further comprising a plurality of output circuits, which are connected in parallel and one of which is constituted of the second amplification transistors and the second base-grounded transistors as well as emitter resistors and a constant current source.

6. A differential amplifier comprising:
- a pair of first emitter-follower transistors for receiving input signals at bases thereof;
- a pair of voltage drop generation circuits for generating voltage drops dependent upon collector currents at the collectors of the first emitter-follower transistors;
- a pair of second emitter-follower transistors which are connected with the first emitter-follower transistors;
- a pair of first amplification transistors whose bases are alternately connected to emitters of the second emitter-follower transistors and whose collectors are connected to emitters of the first emitter-follower transistors;
- a pair of second amplification transistors whose bases are connected to the bases of the first amplification transistors, thus providing output signals;
- a pair of first base-grounded transistors inserted between the emitters of the first emitter-follower transistors and the collectors of the first amplification transistors;
- a pair of second base-grounded transistors which are connected to collectors of the second amplification transistors; and
- a bias circuit for supplying each of the first base-grounded transistors and the second base-grounded transistors with a bias voltage, thus setting a same collector-emitter voltage to each of the first emitter-follower transistors, each of the first amplification transistors, and each of the second amplification transistors.

7. A differential amplifier according to claim 6 further comprising a voltage shift circuit in connection with the second emitter-follower transistors, the first amplification transistors, and the second amplification transistors.

8. A differential amplifier according to claim 7, wherein the bias circuit is constituted of a constant current source and a series circuit which is constituted of a bias transistor whose collector and base are connected together, a second voltage drop circuit for generating a voltage drop dependent upon a collector current of the bias transistor, and a second voltage shift circuit, and wherein the bias voltage is output from a connection point between the series circuit and the constant current source.

9. A differential amplifier according to claim 6 further comprising a pair of third emitter-follower transistors whose emitters are connected to the collectors of the second emitter-follower transistors, wherein the voltage drop generation circuits are constituted of a pair of first collector resistors, which are connected to the collectors of the first emitter-follower transistors, and a pair of second collector resistors, which are connected to the first collector resistors in series, and wherein bases of the third emitter-follower transistors are connected to connection points between the first collector resistors and the second collector resistors.

10. A differential amplifier according to claim 6 further comprising a plurality of output circuits, which are connected in parallel and one of which is constituted of the second amplification transistors and the second base-grounded transistors as well as emitter resistors and a constant current source.

* * * * *